United States Patent
Nakano

(10) Patent No.: US 6,512,427 B2
(45) Date of Patent: *Jan. 28, 2003

(54) SPURIOUS SIGNAL REDUCTION CIRCUIT

(75) Inventor: Yoshiaki Nakano, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/480,737

(22) Filed: Jan. 10, 2000

(65) Prior Publication Data

US 2002/0097114 A1 Jul. 25, 2002

(30) Foreign Application Priority Data

Feb. 16, 1999 (JP) .............................. 11-036623

(51) Int. Cl.⁷ ............................. H03H 7/01; H01P 1/213
(52) U.S. Cl. ....................... 333/132; 333/134; 333/202; 333/176
(58) Field of Search ................................. 333/132, 134, 333/172, 175, 202, 204, 206, 176; 307/105

(56) References Cited

U.S. PATENT DOCUMENTS

| | | | | | |
|---|---|---|---|---|---|
| 3,881,137 A | * | 4/1975 | Thanawala | .............. | 333/175 X |
| 4,701,947 A | * | 10/1987 | Stader | .................... | 379/405 X |
| 5,023,866 A | * | 6/1991 | De Muro | ................ | 333/202 X |

FOREIGN PATENT DOCUMENTS

| | | | | |
|---|---|---|---|---|
| FR | 868344 | * | 12/1941 | ................. 333/175 |
| JP | 54-51758 | | 4/1979 | |
| JP | 1-144824 | | 6/1989 | |
| SU | 1334224 A | * | 8/1987 | |

* cited by examiner

Primary Examiner—Justin P. Bettendorf
(74) Attorney, Agent, or Firm—Katten Muchin Zavis Rosenman

(57) ABSTRACT

A spurious signal reduction circuit which is connected to a main signal line. The spurious signal reduction circuit comprises a resistor having a terminal connected to the main signal line, an LC parallel resonance circuit and an LC series resonance circuit. The parallel resonance circuit has a resonance frequency which is equal to a main signal frequency and has a terminal connected to another terminal of the resistor. The series resonance circuit has a resonance frequency which is equal to a spurious signal frequency and has a terminal connected to the other terminal of the resistor.

10 Claims, 8 Drawing Sheets

FIG.2 ART PRIOR ART
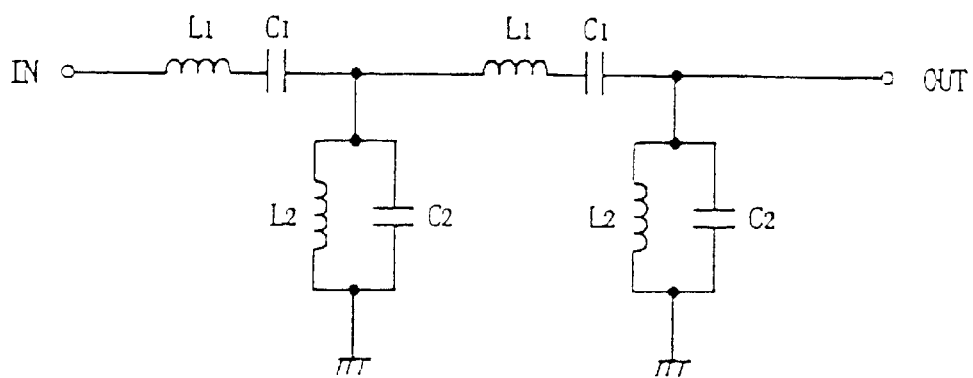
(A)
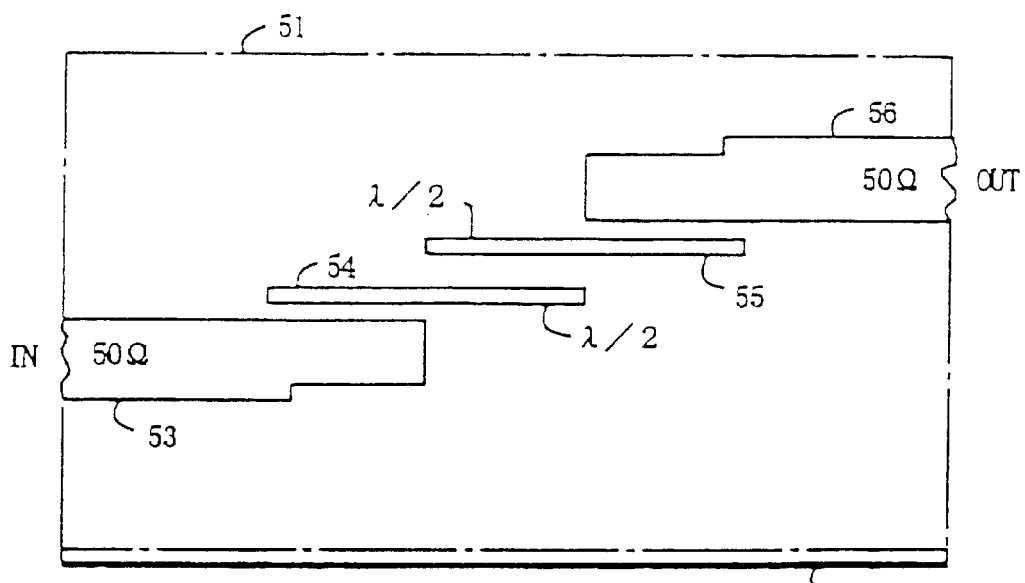
(B)

FIG.3
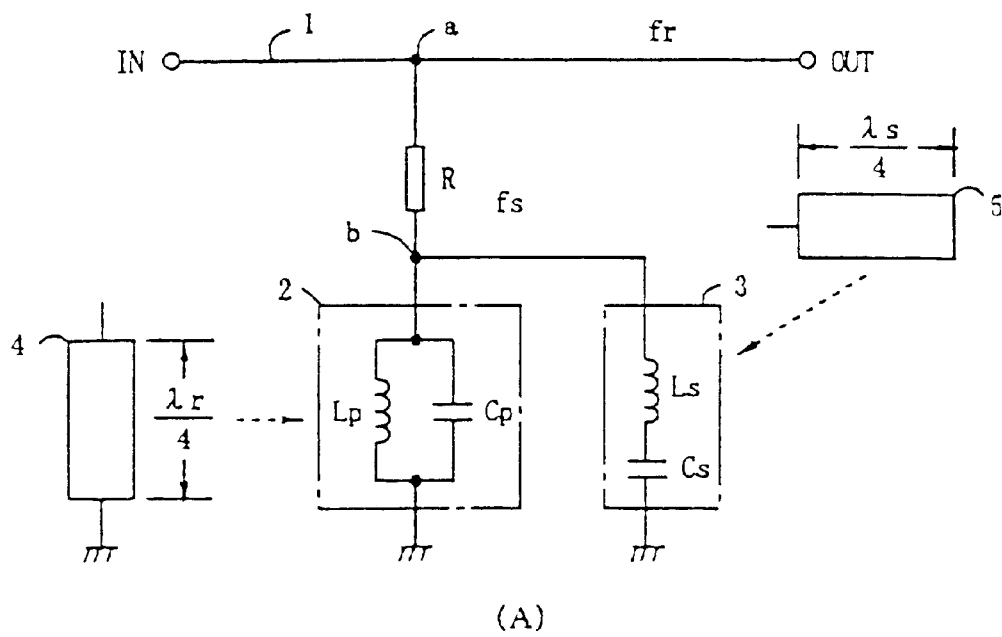
(A)
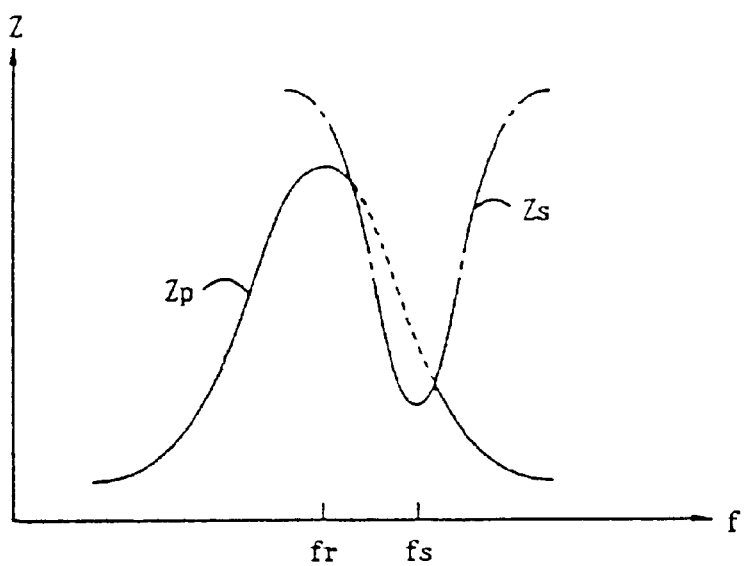
(B)

SPURIOUS SIGNAL REDUCTION CIRCUIT

BACKGROUND OF THE INVENTION

1. Field of the Invention

The present invention generally relates to a spurious signal reduction circuit, and more particularly to a spurious signal reduction circuit which is provided in a main signal circuit in a high-frequency radio transmitter and receiver for a radio communication apparatus, such as a mobile station, a base station and a multiplex station, and can prevent a spurious signal from radiating and mixing.

2. Description of the Related Art

FIG. 1 shows a high-frequency radio part in a conventional radio communication apparatus. In a high-frequency transmitter 10 in the high-frequency radio part, a transmitting baseband signal is modulated by a modulator (MOD) 11 using, for example, a QPSK method into an IF signal. Next, the IF signal is amplified by an IF amplifier (IFA) 12 and a predetermined band-limited IF signal is extracted by an IF filter (IFF) 13. Then, the predetermined band-limited IF signal is up-converted to an RF signal by an RF mixer 14 and a predetermined band-limited RF signal ft is extracted by an RF filter (RFF) 15. Finally, the predetermined band-limited RF signal ft is power-amplified by a high power amplifier (HPA) 16 and transmitted by an antenna 41 through an antenna common part 42.

A received RF signal from the antenna 41 is supplied to a high-frequency receiver 20 in the high-frequency radio part through the antenna common part 42. The received RF signal is amplified by a low-noise amplifier (LNA) 21 and a predetermined band-limited RF signal fr is extracted by an RF filter (RFF) 22. Then, the predetermined band-limited RF signal is down-converted to an IF signal by an RF mixer 23 and a predetermined band-limited IF signal is extracted by IF filters (IFF) 24 and 26. An amplitude of the IF signal is controlled to be a constant value by a feedback loop which comprises IF amplifiers (IFA) 25, 27 and an automatic gain control circuit (AGC) 29. Finally, the IF signal is demodulated by a demodulator (DEM) 28 using the QPSK method into a received base-band signal.

Generally, a radio communication apparatus comprises a plurality of local oscillators and mixers in the same case. Therefore, a spurious signal fs is generated based on a cross-modulation distortion among output signals of the local oscillators and the mixers. To suppress the spurious signal fs, the high-frequency transmitter and receiver are assembled in the form of separate modules. If possible, it is desirable that each RF part and IF part is assembled in the form of a separate module. Then, each module is sufficiently shielded electrically and magnetically and the RF part and the IF part are connected by means of a coaxial cable for a main signal. However, it is basically desirable to suppress a spurious signal at its source or a mixing point.

Conventionally, in the high-frequency transmitter 10 shown in FIG. 1, the RF filter (RFF) 15 is provided between the RF mixer 14 and the HPA 16 to extract the predetermined band-limited RF signal ft and to suppress a radiation of the spurious signal fs. In the high-frequency receiver 20 shown in FIG. 1, the RF filter (RFF) 22 is provided between the LNA 21 and the RF mixer 23 to extract the predetermined band-limited RF signal fr and to prevent the RF signal fr from mixing with the spurious signal fs.

FIG. 2 shows a conventional RF filter. A construction of the RF filter in the high-frequency receiver is the same construction as in the high-frequency transmitter. FIG. 2(A) shows an example of a construction of the RF filter using concentrated constant elements. A band-pass filter is constructed by an LC series circuit comprising an inductor $L_1$ and a capacitor $C_1$ and an LC parallel circuit comprising an inductor $L_2$ and a capacitor $C_2$. A 2nd-order band-pass filter which has a cascade of two band-pass filters is inserted between an input terminal IN and an output terminal OUT of a main signal line. Therefore, only a main signal having a predetermined bandwidth is passed and a spurious RF signal having frequencies other than a passband of the band-pass filter is stopped.

FIG. 2(B) shows an example of a construction of the RF filter using distributed constant elements. Strip lines 54, 55 each having a length equal to a half wavelength $\lambda/2$ of a main signal are placed between an input terminal IN and an output terminal OUT on a dielectric substrate made of GaAs or molten silica, etc., and these components are connected electromagnetically through edges of these components. The strip lines 54, 55 operate as a resonator at the main signal frequency and they construct a band-pass filter. Therefore, only the main signal having a predetermined bandwidth is passed and a spurious RF signal having frequencies other than a pass-band of the bandpass filter is stopped.

However, when the LC series or parallel circuits are inserted in the main signal line shown in FIG. 2(A), a loss of the main signal is increased because resistance components and conductance components are substantially inserted in the main signal line as well as the inductors L1 and L2.

On the other hand, when the resonance lines 54, 55 each having the length $\lambda/2$ are placed as shown in FIG. 2(B), a loss of the main signal is increased due to a conductor loss $\alpha_C$, a dielectric loss $\alpha_D$ and a radiation loss $\alpha_R$. Especially, over a frequency range between 30 GHz to 40 GHz, the radiation loss $\alpha_R$ from the resonance lines 54, 55 can not be ignored and this causes a reduction of a Q value. As a result, the strip lines 54, 55 can not operate as a resonator.

Therefore, in the conventional high-frequency radio apparatus, for a transmitter, a loss of the main signal and power consumption are large and a gain is reduced. On the other hand, for a receiver, a noise figure and a gain are reduced.

SUMMARY OF THE INVENTION

It is a general object of the present invention to provide a spurious signal reduction circuit in which the above disadvantages are eliminated.

A more specific object of the present invention is to provide a spurious signal reduction circuit which can prevent a spurious signal from radiating and mixing without a loss of a main signal.

The above objects of the present invention are achieved by a spurious signal reduction circuit which is connected to a main signal line. The spurious signal reduction circuit comprises a resistor having a terminal connected to the main signal line, an LC parallel resonance circuit and an LC series resonance circuit. The parallel resonance circuit has a resonance frequency which is equal to a main signal frequency and has a terminal connected to another terminal of the resistor. The series resonance circuit has a resonance frequency which is equal to a spurious signal frequency and has a terminal connected to the other terminal of the resistor.

BRIEF DESCRIPTION OF THE DRAWINGS

Other objects, features and advantages of the present invention will become more apparent from the following detailed description when read in conjunction with the accompanying drawings, in which:

FIG. 2 shows a conventional RF filter;

FIG. 3 shows a principle of the present invention;

DESCRIPTION OF THE PREFERRED EMBODIMENTS

Figure 1:
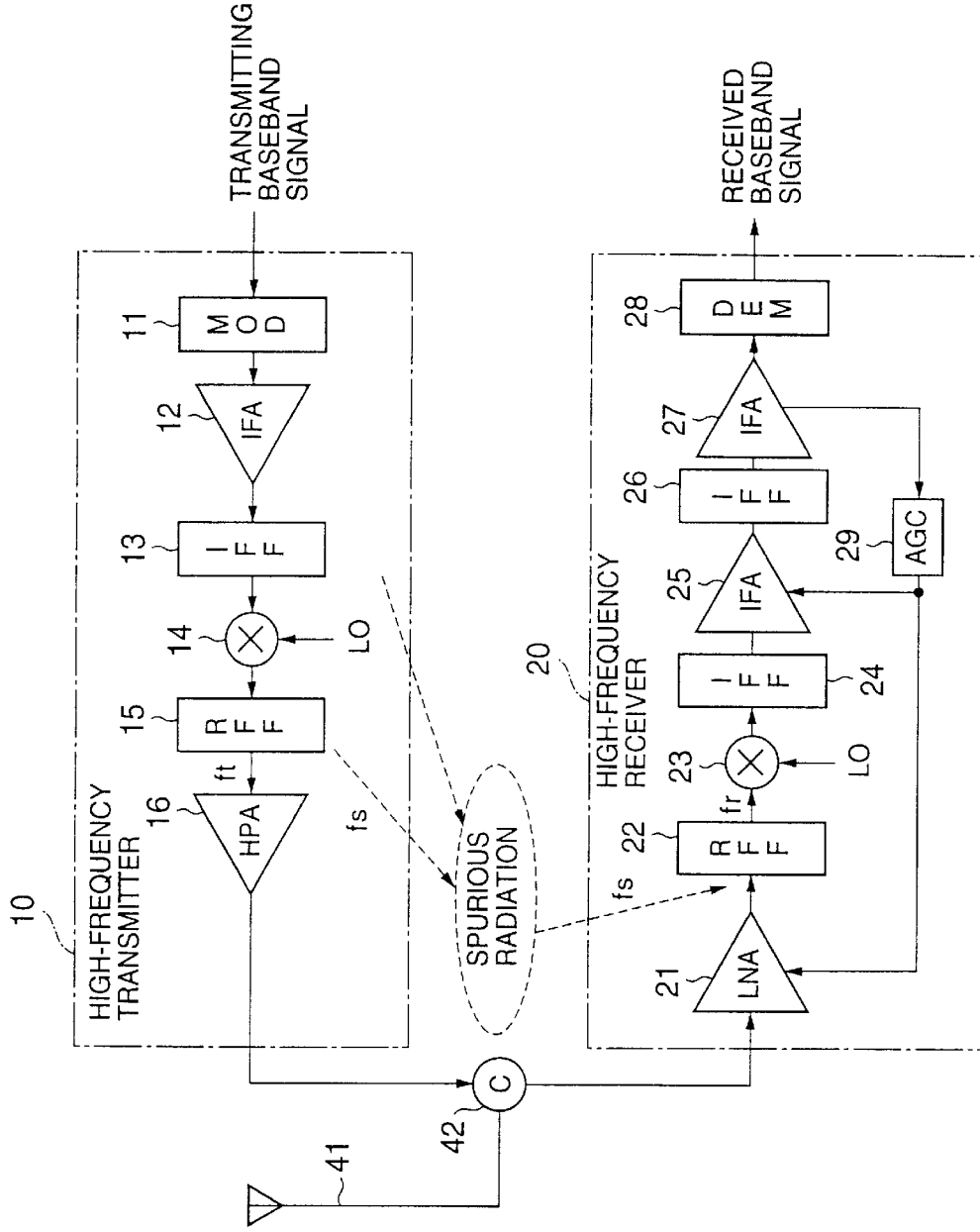
FIG. 1 shows a high-frequency radio part in a conventional radio communication apparatus.

FIG. 3 shows a principle of the present invention. A spurious signal reduction circuit shown in FIG. 3(A) comprises a main signal line 1, a resistor R, an LC parallel resonance circuit 2 which comprises an inductor Lp and a capacitor Cp and an LC series resonance circuit 3 which comprises an inductor Ls and a capacitor Cs. The LC parallel resonance circuit 2 has a resonance frequency which is equal to a main signal frequency fr and the LC series resonance circuit 3 has a resonance frequency which is equal to a spurious signal frequency fs. One end "a" of the resistor R is connected to the main signal line 1 and another end "b" of the resistor R is connected to both one end of the LC parallel resonance circuit 2 and one end of the LC series resonance circuit 3. Another end of the LC parallel resonance circuit 2 is connected to a ground. Another end of the LC series resonance circuit 3 is also connected to the ground.

FIG. 3(B) shows an impedance variation Zp of the LC parallel resonance circuit 2 and an impedance variation Zs of the LC series resonance circuit 3.

The point "b" becomes a high impedance state at the main signal frequency fr due to a parallel resonance operation of the LC parallel resonance circuit 2, as shown in FIG. 3(B). As a result, the point "a" is at the same state as when the resistor R is not connected to the point "a", and thus the resistor R does not affect the main signal line 1. Because there is no loss between an input terminal IN and an output terminal OUT, the main signal is transmitted from the input terminal IN to the output terminal OUT and supplied to a matched load. On the other hand, a signal which has a frequency except for the main signal frequency fr is attenuated by the resistor R when it passes the point "a" because an impedance of the point "b" is reduced, as shown in FIG. 3(B). This circuit operates as a band-pass filter having a predetermined frequency bandwidth which only passes the main signal without any loss. The main signal is efficiently extracted because the Q value of the LC parallel resonance circuit 2 is high.

Furthermore, the point "b" is equivalently connected to the ground at a frequency of the spurious signal frequency fs due to a series resonance operation of the LC series resonance circuit 3. As a result, the spurious signal is sufficiently attenuated by the resistor R when it passes the point "a". Therefore, the spurious signal reduction circuit of the present invention can prevent a spurious signal from radiating and mixing without a loss of the main signal.

Any circuit construction of the LC parallel resonance circuit 2 will do well as long as its parallel resonance frequency is equal to the main signal frequency fr. Furthermore, any circuit construction of the LC series resonance circuit 3 will do well as long as its series resonance frequency is equal to the spurious signal frequency fs.

A distributed constant circuit 4 may be used in place of the LC parallel resonance circuit 2, as shown in FIG. 3(A). The distributed constant circuit 4 has a length of a quarter of a wavelength $\lambda_r$ of the main signal frequency fr and one end of the distributed constant circuit 4 is connected to a ground. Another end of the distributed constant circuit 4 is connected to the point "b" and is in an open state at the main signal frequency fr. Therefore, the point "b" is in a high impedance state at the main signal frequency fr and the resistor R does not affect the main signal line 1. On the other hand, a signal which has a frequency except for the main signal frequency fr is attenuated by the resistor R when it passes the point "a" because an impedance of the point "b" is reduced, as shown in FIG. 3(B). Therefore, the distributed constant circuit 4 has the same effect on the main signal line 1 as the LC parallel resonance circuit 2 over a microwave band.

A distributed constant circuit (a stub) 5 may be used in place of the LC series resonance circuit 3, as shown in FIG. 3(A). The distributed constant circuit 5 has a length of a quarter of a wavelength $\lambda_s$ of the spurious signal frequency fs and one end of the distributed constant circuit 5 is opened. Another end of the distributed constant circuit 5 is connected to the point "b" and is equivalently connected to a ground at the frequency of the spurious signal frequency fs. As a result, the spurious signal is sufficiently attenuated by the resistor R when it passes the point "a". Therefore, the distributed constant circuit 5 has the same effect on the main signal line 1 as the LC series resonance circuit 3 over a microwave band.

Next, a first embodiment of a high-frequency radio apparatus according to the present invention will be explained.

In the figure, the same reference numbers are used to indicate the same components.

Figure 4:
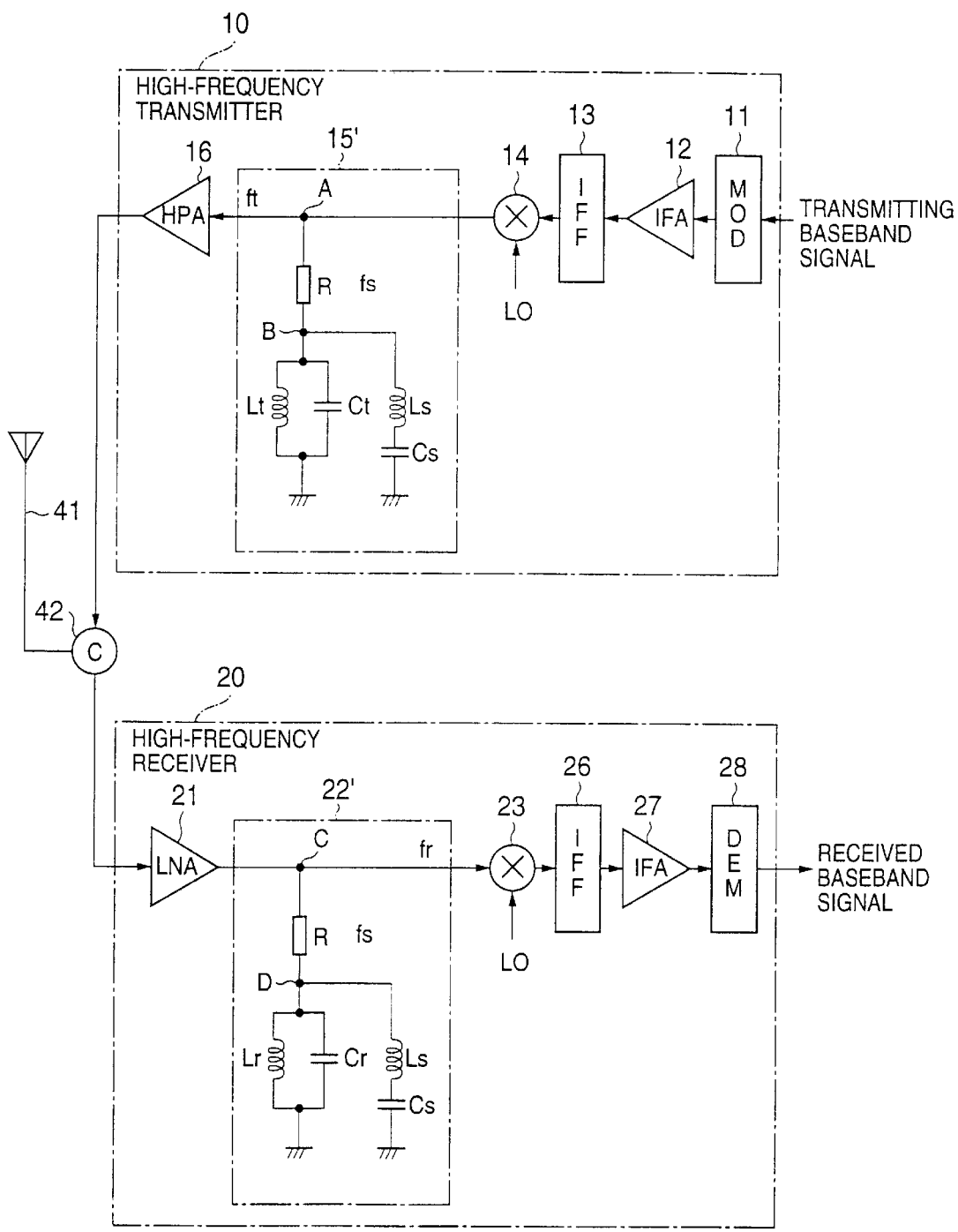
FIG. 4 shows a first embodiment of a high-frequency radio apparatus according to the present invention.

FIG. 4 shows the first embodiment of a high-frequency radio apparatus according to the present invention. The spurious signal reduction circuit is constructed using concentrated constant elements. A reference numeral 15' shows a spurious signal reduction circuit which is provided in place of the RF filter (RFF) 15 in FIG. 1 and a reference numeral 22' shows a spurious signal reduction circuit which is provided in place of the RF filter (RFF) 22 in FIG. 1.

In the spurious signal reduction circuit 15' in the high-frequency transmitter 10, an output of the RF mixer 14 is connected to an input of the HPA 16 by a transmission line (a main signal line) having a characteristic impedance 50 Ω. Therefore, there is no loss of the main signal ft. One end "A" of a resistor R is connected to the main signal line, and another end "B" of the resistor R is connected to one end of an LC parallel resonance circuit which comprises an inductor Lt and a capacitor Ct and one end of an LC series resonance circuit which comprises an inductor Ls and a capacitor Cs. Another end of the LC parallel resonance circuit is connected to a ground. Another end of the LC series resonance circuit is also connected to the ground. The inductor Lt and the capacitor Ct are selected so that a parallel resonance frequency (Zt≈∞) is equal to a transmission frequency ft of the main signal, ft=½π√(LtCt). Also the inductor Ls and the capacitor Cs are selected so that a series resonance frequency (Zs≈0) is equal to a spurious signal frequency fs=½π√(LsCs).

The point "B" is in a high impedance state at a transmission frequency ft of the transmission signal due to a parallel resonance operation of Lt and Ct. As a result, the point "A" is in the same state as when the resistor R is not connected to the point "A" and the transmission signal ft passes through the main signal line without attenuation. On the other hand, the point "B" is equivalently connected to the ground at a frequency of the spurious signal frequency fs (≠ft) due to a series resonance operation of the Ls and Cs. As a result, the spurious signal fs (≠ft) is sufficiently attenuated by the resistor R when it passes the point "A". Therefore, the spurious signal reduction circuit 15' can prevent a spurious signal fs from radiating without a loss of the transmission signal ft.

In the spurious signal reduction circuit 22' in the high-frequency receiver 20, an output of the LNA 21 is connected to an input of the RF mixer 23 by a transmission line (a main signal line) having a characteristic impedance 50 Ω. Therefore, there is no loss of the main signal fr. One end "C" f of a resistor R is connected to the main signal line, and another end "D" of the resistor R is connected to one end of an LC parallel resonance circuit which comprises an inductor Lr and a capacitor Cr and one end of an LC series resonance circuit which comprises an inductor Ls and a capacitor Cs. Another end of the LC parallel resonance circuit is connected to a ground. Another end of the LC series resonance circuit is also connected to the ground. The inductor Lr and the capacitor Cr are selected so that a parallel resonance frequency (Zr≈∞) is equal to a reception frequency fr of the main signal fr=½π√(LrCr). Also the inductor Ls and the capacitor Cs are selected so that a series resonance frequency (Zs≈0) is equal to a spurious frequency fs=½π√(LsCs).

The point "D" is in a high impedance state at a reception frequency fr of the reception signal due to a parallel resonance operation of Lr and Cr. As a result, the point "C" is in the same state as when the resistor R is not connected to the point "C" and the reception signal fr passes through the main signal line without attenuation. On the other hand, the point "D" is equivalently connected to the ground at a frequency of the spurious signal frequency fs(≠fr) due to a series resonance operation of the Ls and Cs. As a result, the spurious signal fs (≠fr) is sufficiently attenuated by the resistor R when it passes the point "C". Therefore, the spurious signal reduction circuit 22' can prevent a spurious signal fs from mixing without a loss of the reception signal fr.

It is possible to modify an attenuation if a resistance of the resistor R is modified.

Figure 5:
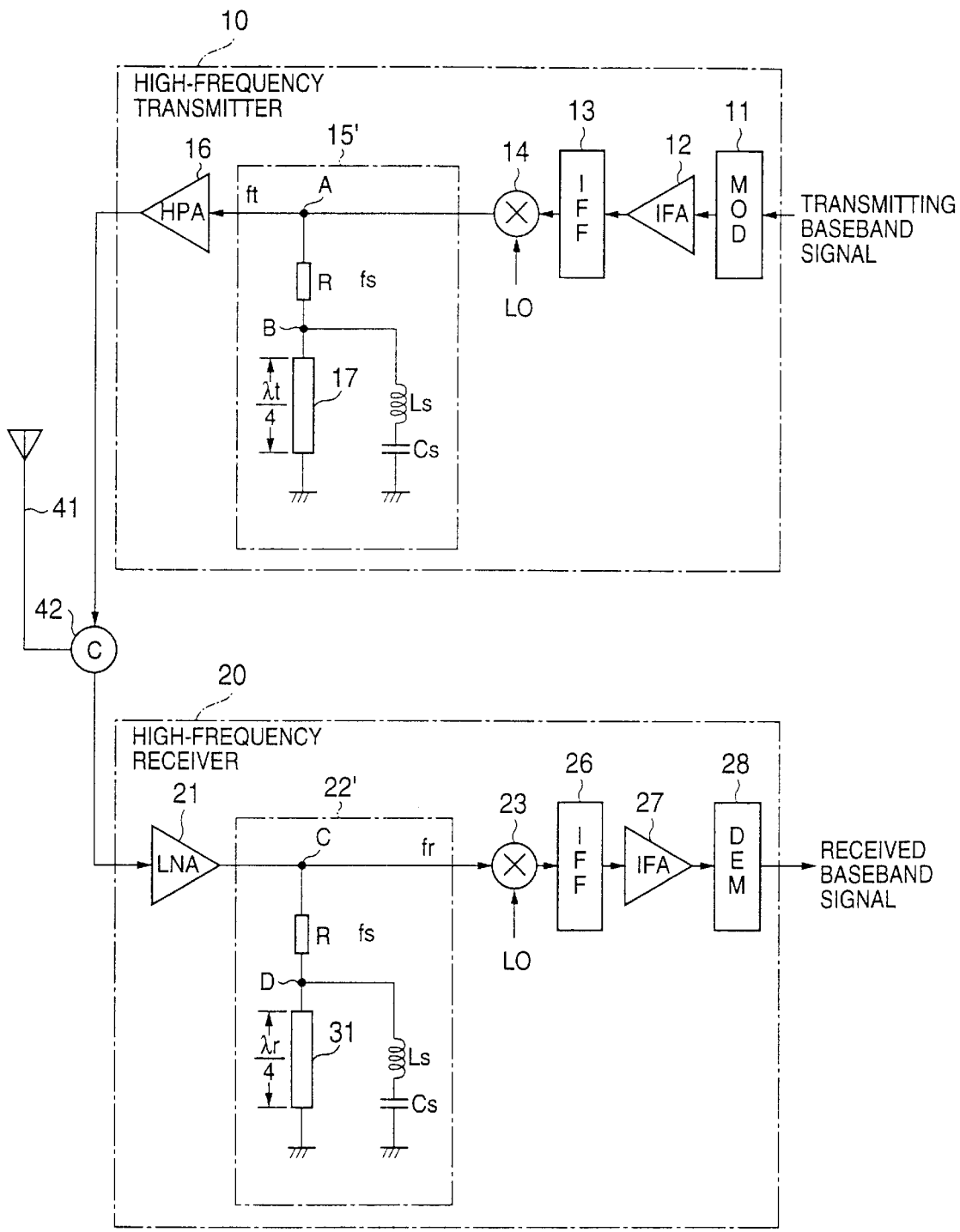
FIG. 5 shows a second embodiment of a high-frequency radio apparatus according to the present invention.

Next, a second embodiment of a high-frequency radio apparatus according to the present invention will be explained. FIG. 5 shows the second embodiment of the high-frequency radio apparatus according to the present invention. Distributed constant circuits (stubs) 17 and 31 are used in place of the LC parallel resonance circuits shown in FIG. 4. Other components are the same as those shown in FIG. 4.

The stub 17 in the high-frequency transmitter 10 in the spurious signal reduction circuit 15' has a length $\lambda_t/4$ which is a quarter of a transmission signal wavelength $\lambda_t$, and one end of the stub 17 is connected to a ground. Another end of the stub 17 is connected to the point "B" and is in an open state at the transmission signal frequency ft. Therefore, the point "B" is in a high impedance state at the frequency of the transmission signal frequency ft. As a result, the point "A" is in the same state as when the resistor R is not connected to the point "A" and the transmission signal ft passes through the main signal line without attenuation. On the other hand, the point "B" is equivalently connected to the ground at the frequency of the spurious signal frequency fs (≠ft) due to a series resonance operation of the Ls and Cs. As a result, the spurious signal fs is sufficiently attenuated by the resistor R.

The stub 31 in the high-frequency receiver 20 in the spurious signal reduction circuit 22' has a length $\lambda_r/4$ which is a quarter of a reception signal wavelength $\lambda_r$, and one end of the stub 31 is connected to a ground. Another end of the stub 31 is connected to the point "D" and is in an open state at the reception signal frequency fr. Therefore, the point "D" is in a high impedance state at the reception signal frequency fr. As a result, the point "C" is in the same state as when the resistor R is not connected to the point "C" and the reception signal fr passes through the main signal line without attenuation. On the other hand, the point "D" is equivalently connected to the ground at a frequency of the spurious signal frequency fs (≠fr) due to a series resonance operation of the Ls and Cs. As a result, the spurious signal fs is sufficiently attenuated by the resistor R.

Figure 6:
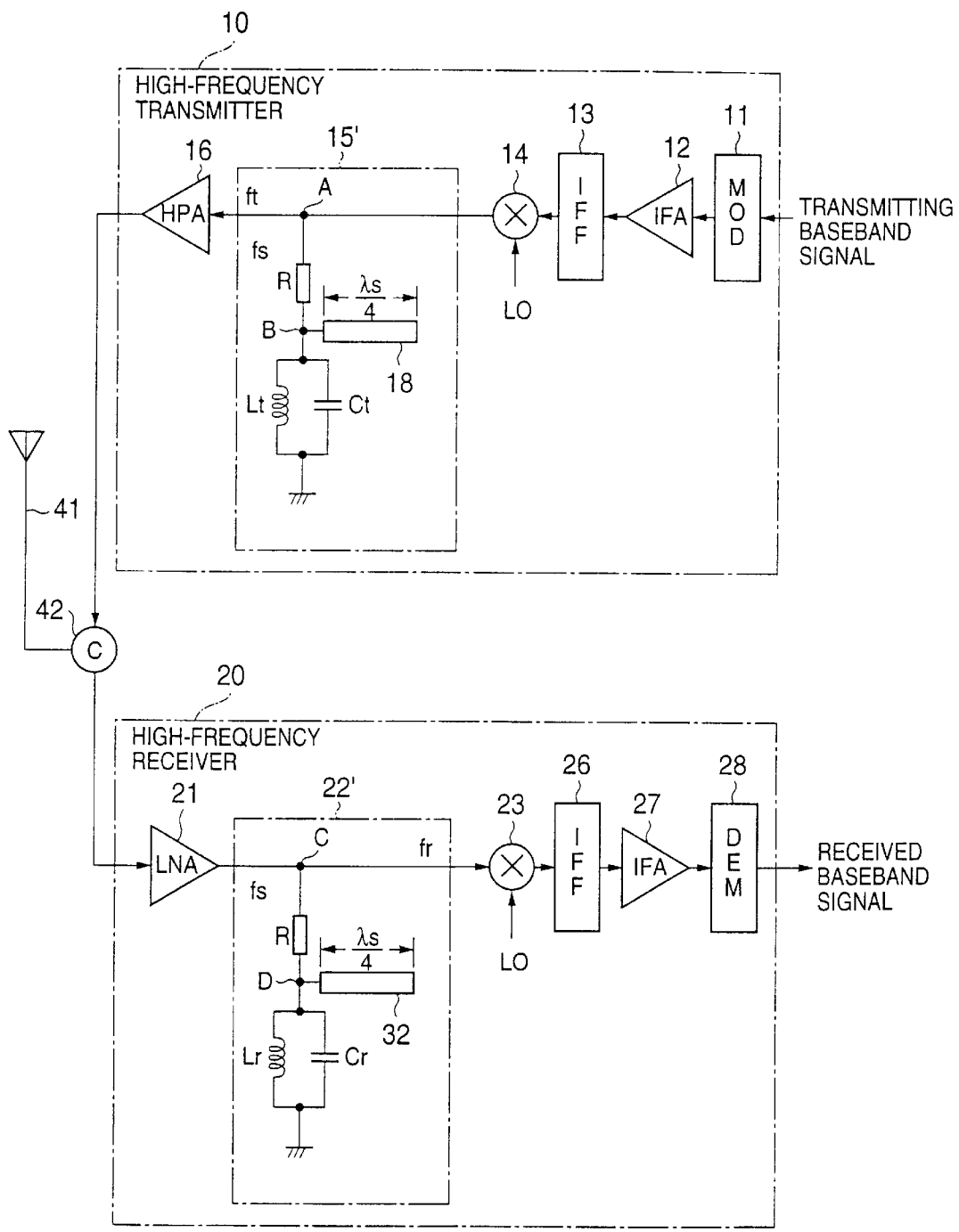
FIG. 6 shows a third embodiment of a high-frequency radio apparatus according to the present invention.

Next, a third embodiment of a high-frequency radio apparatus according to the present invention will be explained. FIG. 6 shows the third embodiment of the high-frequency radio apparatus according to the present invention. Distributed constant circuits (stubs) 18 and 32 are used in place of the LC serial resonance circuits shown in FIG. 4. Other components are the same as those shown in FIG. 4.

The stub 18 in the high-frequency transmitter 10 in the spurious signal reduction circuit 15' has a length $\lambda_s/4$ which is a quarter of a transmission signal wavelength $\lambda_s$, and one end of the stub 17 is opened. Another end of the stub 18 is connected to the point "B" and is equivalently connected to a ground at the frequency of the spurious signal frequency fs. As a result, the spurious signal is sufficiently attenuated by the resistor R.

The stub 32 in the high-frequency receiver 20 in the spurious signal reduction circuit 22' has a length $\lambda_s/4$ which is a quarter of the spurious signal wavelength $\lambda_s$, and one end of the stub 32 is opened. Another end of the stub 32 is connected to the point "D" and is equivalently connected to a ground at a frequency of the spurious signal frequency fs. As a result, the spurious signal is sufficiently attenuated by the resistor R.

Figure 7:
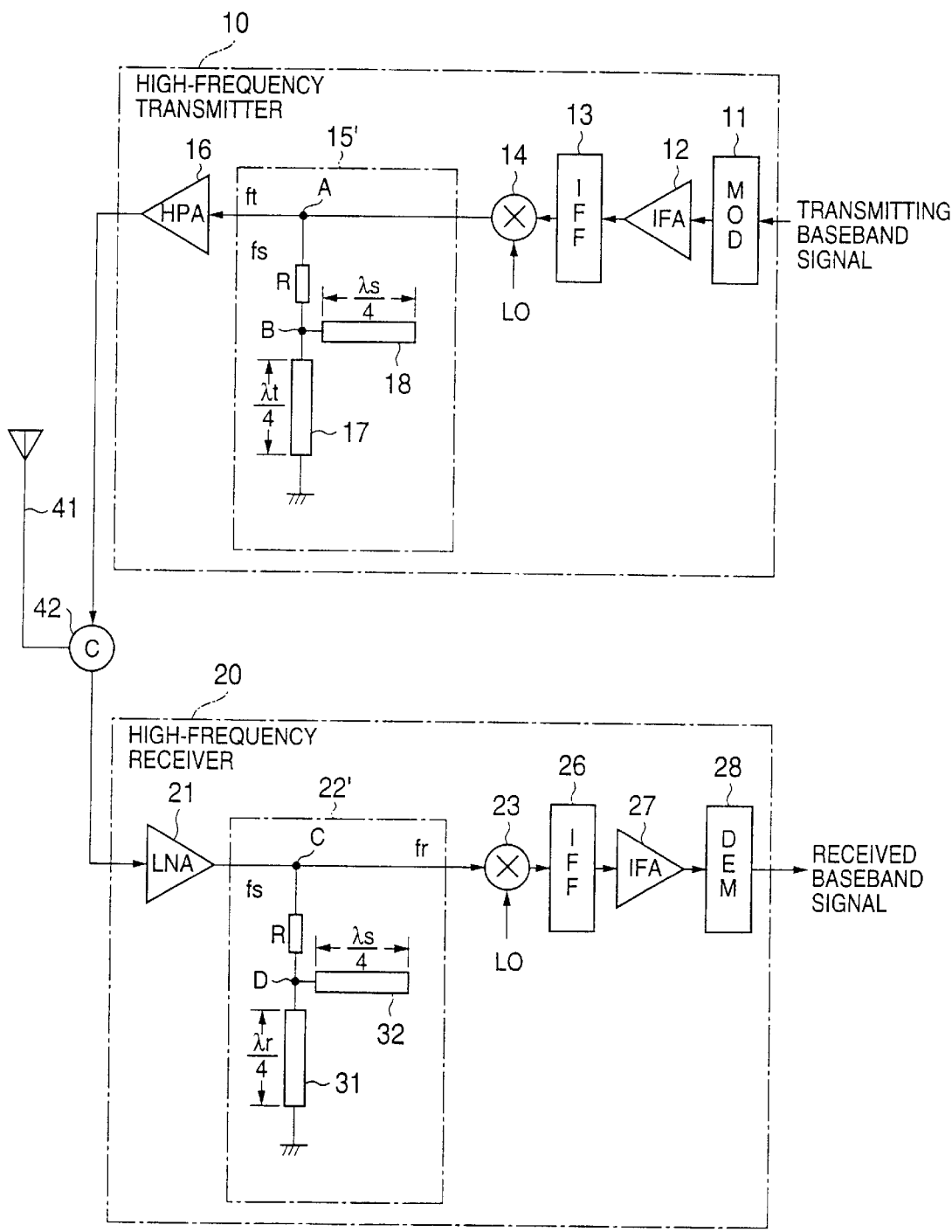
FIG. 7 shows a fourth embodiment of a high-frequency radio apparatus according to the present invention.
Figure 8:
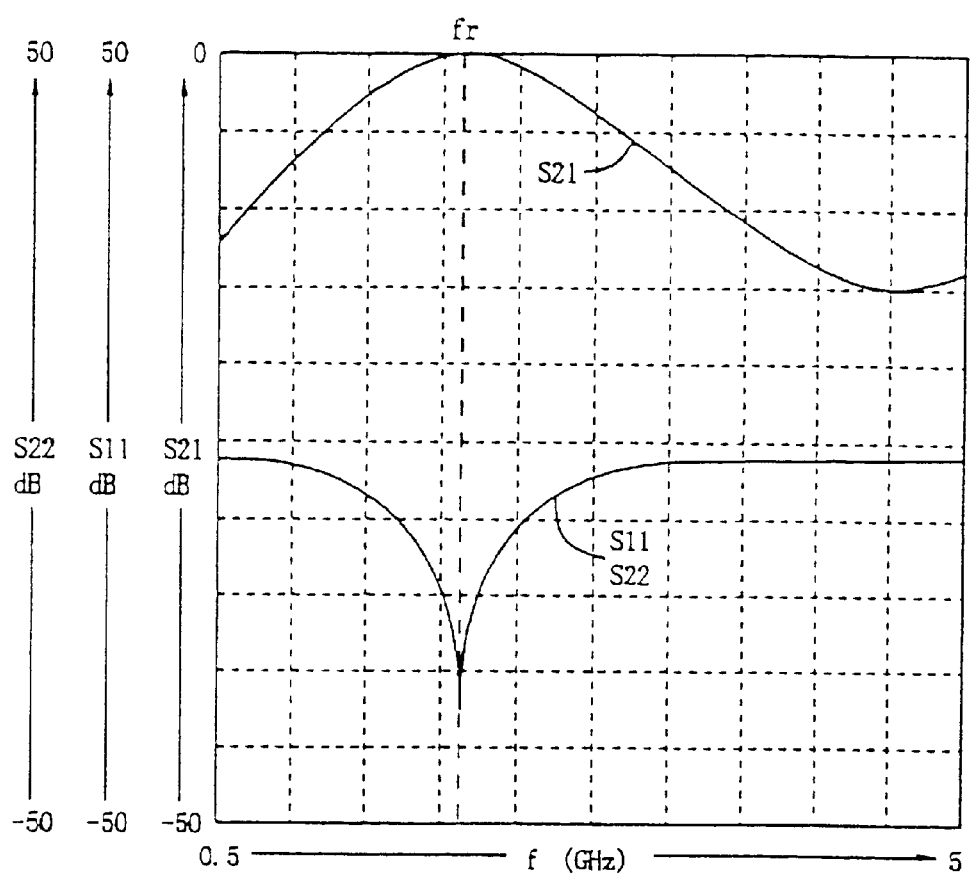
FIG. 8 shows an S-characteristic of the fourth embodiment of the high-frequency radio apparatus according to the present invention.

Next, a fourth embodiment of a high-frequency radio apparatus according to the present invention will be explained. FIG. 7 shows the fourth embodiment of the high-frequency radio apparatus according to the present invention and FIG. 8 shows an S-characteristic of the fourth embodiment of the high-frequency radio apparatus according to the present invention. Distributed constant circuits (stubs) 17 and 31 are used in place of the LC parallel resonance circuits shown in FIG. 4. and distributed constant circuits (stubs) 18 and 32 are used in place of the LC serial resonance circuits shown in FIG. 4. Other components are the same as shown in FIG. 4.

The stub 17 in the high-frequency transmitter 10 in the spurious signal reduction circuit 15' shown in FIG. 7 has a length $\lambda_t/4$ which is a quarter of a transmission signal wavelength $\lambda_t$, and one end of the stub 17 is connected to a ground. Another end of the stub 17 is connected to the point "B" and is in an open state at the transmission signal frequency ft. Therefore, the point "B" is in a high impedance state at the transmission signal frequency ft. As a result, the point "A" is in the same state as when the resistor R is not connected to the point "A" and the transmission signal ft passes through the main signal line without attenuation. The stub 18 in the high-frequency transmitter 10 in the spurious signal reduction circuit 15' has a length $\lambda_s/4$ which is a quarter of a spurious signal wavelength $\lambda_s$, and one end of the stub 17 is opened. Another end of the stub 18 is connected to the point "B" and is equivalently connected to a ground at the frequency of the spurious signal frequency fs. As a result, the spurious signal is sufficiently attenuated by the resistor R.

The stub 31 in the high-frequency receiver 20 in the spurious signal reduction circuit 22' has a length $\lambda_r/4$ which is a quarter of a reception signal wavelength $\lambda_r$, and one end of the stub 31 is connected to a ground. Another end of the stub 31 is connected to the point "D" and is in an open state at the reception signal frequency fr. Therefore, the point "D" is in a high impedance state at the reception signal frequency fr. As a result, the point "C" is in the same state as when the resistor R is not connected to the point "C" and the reception signal fr passes through the main signal line without attenuation. The stub 32 in the high-frequency receiver 20 in the spurious signal reduction circuit 22' has a length $\lambda_s/4$ which is a quarter of a spurious signal wavelength $\lambda_s$, and one end of the stub 32 is opened. Another end of the stub 32 is connected to the point "D" and is equivalently connected to a ground at the frequency of the spurious signal frequency fs. As a result, the spurious signal is sufficiently attenuated by the resistor R.

FIG. 8 shows an S-characteristic of the fourth embodiment of the high-frequency radio apparatus according to the present invention by a computer simulation. For example, when the reception frequency fr is equal to 2.1 GHz, a low passing loss S21 of about −0.1 dB is obtained. On the other hand, for example, an out-band attenuation is about −15 dB at a frequency in the vicinity of 4.5 GHz.

Furthermore, it is possible to modify an attenuation characteristic of the spurious signal reduction circuit by modifying a width of each stub 17, 18, 31 and 32 because a conductor loss of each stub varies according to the width of each stub.

In each embodiment mentioned above, a single spurious reduction circuit 15' or 22' is provided for each main signal line. However, if a further attenuation of the spurious signal is required, a cascade of the spurious signal reduction circuits may be provided.

In each embodiment mentioned above, a substrate has a ground conductor on its back side and a single strip line on its front side. However, it is not limited to the specifically disclosed embodiments. This invention is applicable to various kinds of strip lines, such as a suspended microstrip line, a reverse microstrip line, a connected microstrip line, a slot line, a coplanar strip line, a coplanar line and so on.

The present invention is not limited to the specifically disclosed embodiments, and variations and modifications may be made without departing from the scope of the present invention.

The present application is based on Japanese priority application No. 11-036623 filed on Feb. 16, 1999, the entire contents of which are hereby incorporated for reference.

What is claimed is:

1. A spurious signal reduction circuit which is connected to a main signal line, the circuit comprising:
a resistor having a terminal connected to the main signal line;
an LC parallel resonance circuit having a resonance frequency which is equal to a main signal frequency and having a terminal directly connected to another terminal of said resistor; and
an LC series resonance circuit having a resonance frequency which is equal to a spurious signal frequency and having a terminal directly connected to the connection point of said other terminal of said resistor and said LC parallel resonance circuit, and said LC series resonance circuit also directly connected to said LC parallel resonance circuit in parallel,
wherein said resistor is connected in series between said main signal line and the parallel combination of said LC parallel resonance circuit and said LC series resonance circuit.

2. The spurious signal reduction circuit of claim 1, wherein said LC parallel resonance circuit having a second terminal connected to ground and said LC series resonance circuit having a second terminal connected to said ground, and said spurious signal reduction circuit is coupled to said main signal line via said terminal of said resistor.

3. A spurious signal reduction circuit which is connected to a main signal line, the circuit comprising:
a resistor having a terminal connected to the main signal line;
an LC parallel resonance circuit having a resonance frequency which is equal to a main signal frequency and having a terminal directly connected to another terminal of said resistor; and
a distributed constant circuit having a length equal to a quarter of a wavelength of a spurious signal frequency and one end opened, said distributed constant circuit having a resonance frequency which is equal to a spurious signal frequency and having another end directly connected to the connection point of said other terminal of said resistor and said LC parallel resonance circuit,
wherein said resistor is connected in series between said main signal line and said LC parallel resonance circuit.

4. The spurious signal reduction circuit of claim 3, wherein said LC parallel resonance circuit having a second terminal connected to said ground, and said spurious signal reduction circuit is coupled to said main signal line via said terminal of said resistor.

5. A radio apparatus comprising:
a resistor having a first terminal connected to the main signal line and a second terminal;
either an LC parallel resonance circuit having a first resonance frequency which is equal to a main signal frequency and having a terminal directly connected to said second terminal of said resistor, or a first distributed constant circuit having a length equal to a quarter of a wavelength of the main signal frequency and one end connected to a ground, said distributed constant circuit having said first resonance frequency and having another end directly connected to said second terminal of said resistor; and
either an LC series resonance circuit having a second resonance frequency which is equal to a spurious signal frequency and having a terminal directly connected to said second terminal of said resistor, or a second distributed constant circuit having a length equal to a quarter of a wavelength of said spurious signal frequency and one end opened, said distributed constant circuit having said second resonance frequency and having another end directly connected to said second terminal of said resistor and also directly connected to either said LC parallel resonance circuit or said first distributed constant circuit, wherein said resistor is connected in series between said main signal line and the connection point of said second terminal of said resistor with said either of the LC parallel resonance circuit or the first distributed constant circuit.

6. The radio apparatus of claim 5, wherein said LC parallel resonance circuit having a second terminal connected to said ground and said LC series resonance circuit having a second terminal connected to said ground, said LC parallel resonance circuit said LC series resonance circuit being a parallel combination, and said spurious signal reduction circuit is coupled to said main signal line via said terminal of said resistor.

7. A spurious signal reduction circuit which is connected to a main signal line, the circuit comprising:

a resistor having a terminal connected to the main signal line;

a distributed constant circuit having length equal to a quarter of a wavelength of a main signal frequency and one end connected to a ground, said distributed constant circuit having a resonance frequency which is equal to the main signal frequency and having a second end directly connected to another terminal of said resistor; and an LC series resonance circuit having a resonance frequency which is equal to a spurious signal frequency and having a terminal directly connected to the connection point of said other terminal of said resistor and said second end of said distributed constant circuit, wherein said resistor is connected in series between said main signal line and the connection point of said other terminal of said resistor, said second end of said distributed constant circuit and said terminal of said LC series resonance circuit.

8. The spurious signal reduction circuit of claim 7, wherein said LC series resonance circuit having a second terminal connected to said ground, and said spurious signal reduction circuit is coupled to said main signal line via said terminal of said resistor.

9. A spurious signal reduction circuit which is connected to a main signal line, the circuit comprising:

a resistor having a terminal connected to the main signal line;

a first distributed constant circuit having a length equal to a quarter of a wavelength of a main signal frequency and one end connected to a ground, said distributed constant circuit having a resonance frequency which is equal to the main signal frequency and having a second end directly connected to another terminal of said resistor; and a second distributed constant circuit having a length equal to a quarter of a wavelength of a spurious signal frequency and one end opened, said second distributed constant circuit having a resonance frequency which is equal to a spurious signal frequency and having a second end directly connected to the connection point of said other terminal of said resistor and said second end of said first distributed constant circuit, wherein said resistor is connected in series between said main signal line and the connection point of said other terminal of said resistor, said second end of said first distributed constant circuit and said second end of said second distributed constant circuit.

10. The spurious signal reduction circuit of claim 9, wherein said spurious signal reduction circuit is coupled to said main signal line via said terminal of said resistor.

* * * * *